US006274421B1

United States Patent
Hsu et al.

(10) Patent No.: US 6,274,421 B1
(45) Date of Patent: *Aug. 14, 2001

(54) METHOD OF MAKING METAL GATE SUB-MICRON MOS TRANSISTOR

(75) Inventors: Sheng Teng Hsu, Camas, WA (US); David R. Evans, Beaverton, OR (US); Tue Nguyen, Vancouver, WA (US)

(73) Assignees: Sharp Laboratories of America, Inc., Camas, WA (US); Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/004,991

(22) Filed: Jan. 9, 1998

(51) Int. Cl.[7] .................................. H01L 21/8238
(52) U.S. Cl. ..................... 438/233; 438/197; 438/585; 438/592; 438/653; 438/692
(58) Field of Search .................. 438/197, 229, 438/230, 233, 585, 592, 595, 653, 692; 257/752, 753

(56) References Cited

U.S. PATENT DOCUMENTS

| | | | |
|---|---|---|---|
| 3,617,824 | * 11/1971 | Shinoda et al. | 257/407 |
| 4,694,565 | * 9/1987 | Custode | 438/217 |
| 4,702,792 | 10/1987 | Chow et al. | 156/628 |
| 4,914,500 | * 4/1990 | Liu et al. | 257/384 |
| 4,944,836 | 7/1990 | Beyer et al. | 156/645 |
| 4,954,142 | 9/1990 | Carr et al. | 51/309 |
| 4,956,311 | * 9/1990 | Liou et al. | 438/231 |
| 5,451,546 | 9/1995 | Grubisich et al. | 437/200 |
| 5,639,686 | 6/1997 | Hirano et al. | 437/189 |
| 5,656,519 | 8/1997 | Mogami | 438/303 |
| 5,661,052 | * 8/1997 | Inoue et al. | 438/303 |
| 5,767,004 | * 6/1998 | Balasubramanian et al. | 438/592 |
| 5,786,255 | 7/1998 | Yeh et al. | 438/299 |
| 5,821,145 | 10/1998 | Goo | 438/294 |
| 5,858,843 | 1/1999 | Doyle et al. | 438/299 |
| 5,950,081 | * 9/1999 | Chang | 438/227 |
| 5,960,270 | * 9/1999 | Misra et al. | 438/197 |
| 5,966,597 | * 10/1999 | Wright | 438/197 |

FOREIGN PATENT DOCUMENTS

0319213 A2   11/1988   (EP) .

OTHER PUBLICATIONS

Article entitled, "Chemical–Mechanical Polishing for Fabricating Patterned W Metal Features as Chip Interconnects", by Kaufman, et al., published in J. Electrochem. Soc., vol. 138, No. 11, Nov. 1991, pp. 3460–3465.
Chatterjee et al., *Sub–100nm Gate Length Metal Gate NMOS Transistors Fabricated by a Replacement Gate Process*, International Electron Devices Meeting, Dec. 7–10, 1997, pp. 821–824.
Burns, Stanley G. and Bond, Paul R., Principles of Electronic Circuits, West Publishing Co. 1987, p. 194.*

* cited by examiner

*Primary Examiner*—Eddie Lee
*Assistant Examiner*—N. Drew Richards
(74) *Attorney, Agent, or Firm*—David C. Ripma; Matthew D. Rabdau; Scott C. Krieger

(57) ABSTRACT

A MOS transistor is formed on a single crystal silicon substrate doped to form a conductive layer of a first type, and includes: an active region formed on said substrate; a source region and a drain region located in said active region, doped to form conductive channels of a second type; a metal gate region located in said active region between said source region and said drain region, wherein said metal gate has a width of less than one micron; a gate oxide region located over said gate region; an oxide region located over the structure; and a source electrode, a gate electrode and a drain electrode, each connected to their respective regions, and each formed of a combination of a contact metal and an electrode metal. An alternate embodiment includes a pair of MOS transistors which have an interconnect between their gate electrodes and the drain electrode of one transistor and the drain electrode of the other transistor.

18 Claims, 4 Drawing Sheets

US 6,274,421 B1

METHOD OF MAKING METAL GATE SUB-MICRON MOS TRANSISTOR

FIELD OF THE INVENTION

The invention relates to MOS semiconductor devices and fabrication methods therefor, and specifically to a MOS transistor having an exceptionally thin metal gate therein.

BACKGROUND OF THE INVENTION

A great variety of metal-oxide-semiconductor (MOS) devices are known. It is desirable in such devices to provide a very short channel length in the gate region of the integrated circuit. One way to accomplish this is to use an $n^+$ or $p^+$ doped dual polarity polysilicon gate. In the process of forming such a gate, boron or boron compounds are implanted into the substrate, which generally results in the boron compounds penetrating too deep into the substrate. Additionally, the doping density of such compounds must be quite high, otherwise the gate will be depleted which results in a low channel current density.

Chattejee et al, have discussed this problem in connection with a sub-100 nm gate structure formed by replacing polysilicon above a gate region in Sub-100 nm Gate Length Metal Gate NMOS Transistors Fabricated by a Replacement Gate Process, International Electron Devices Meeting, Dec. 7–10, 1997, pp 821–824.

Known metal gate fabrication processes are complicated and pose difficult structural considerations during the fabrication of self-aligned components. For instance, copper makes an ideal metal gate, but it has poor adhesive characteristics as a thin film. Aluminum may also be used as a metal gate, but it is subject to electromigration problems.

SUMMARY OF THE INVENTION

The MOS transistor of the invention is formed on a single crystal silicon substrate doped to form a conductive layer of a first type, and includes: an active region formed on a substrate; a source region and a drain region located in the active region, doped to form conductive channels of a second type; a metal gate region located in the active region between the source region and the drain region, wherein the metal gate has a width of less than one micron; a gate oxide region located over the gate region; an oxide region located over the structure; and a source electrode, a gate electrode and a drain electrode, each connected to their respective regions, and each formed of a combination of a contact metal and an electrode metal. An alternate embodiment includes a pair of MOS transistors which have an interconnect between their gate electrodes and the drain electrode of one transistor and the drain electrode of the other transistor.

An object of the invention is to provide a cost effective method for manufacturing a metal gate sub-micron channel length MOS integrated circuit. Another object of the invention is to provide a metal gate sub-micron channel length MOS integrated circuit which has a high current density.

These and other objects and advantages of the invention will become more fully apparent as the description which follows is read in conjunction with the drawings.

DETAILED DESCRIPTION OF THE PREFERRED EMBODIMENTS

In the examples given herein, copper is used as the metal to provide a metal gate sub-micron metal-oxide semiconductor (MOS) transistor. "Sub-micron" means that the metal gate used in the structure of the invention is less than 1000 nm in width. It will be appreciated that any suitable integrated circuit interconnect material, which includes all refractory metals, the most common of which is aluminum, may be used. In the examples provided herein, an $n^-$ channel MOS transistor will be used, although the structure and fabrication process may also be used to provide a $p^-$ channel MOS transistor and complimentary metal-oxide semiconductor (CMOS) integration, provided proper doping of the silicon substrate is initially performed.

Figure 1:
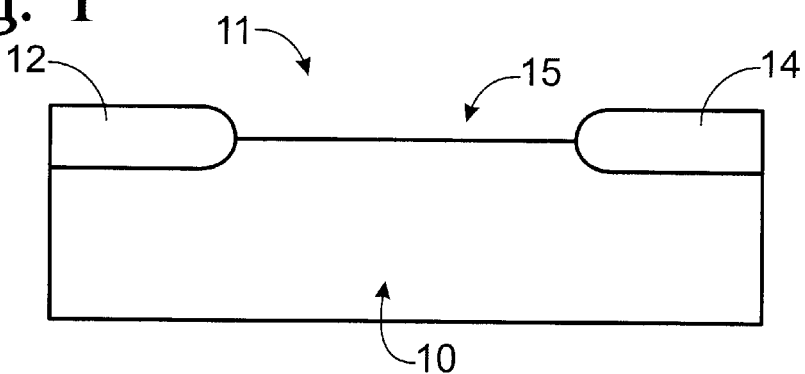
FIGS. 1–6 depict successive steps in the fabrication of the metal gate sub-micron MOS transistor of the invention.

Referring now to FIG. 1, a silicon substrate 10 is provided, which will be used to form a MOS transistor 11. Substrate 10 has been processed to form an oxide insulation boundary about an active region, shown as boundaries 12, 14, over a $p^-$ silicon substrate, defining a device area 15. It will be understood by those of skill in the art that the silicon substrate is treated to prepare a $p^-$ well by doping impurities of a first type, thereby forming a conductive channel of a first type, and to have the threshold voltage adjustments suitable for fabrication of the device of the invention. For instance, $p^-$ substrate 10 may be formed by single boron ion implantation at an energy level or 30 keV to 80 keV and a dose of $1.0 \cdot 10^{12}$ cm$^{-2}$ to $1.0 \cdot 10^{14}$ cm$^{-2}$, followed by thermal diffusion. Alternately, $p^-$ substrate 10 may be formed by multiple boron ion implantation, followed by thermal diffusion.

Figure 2:
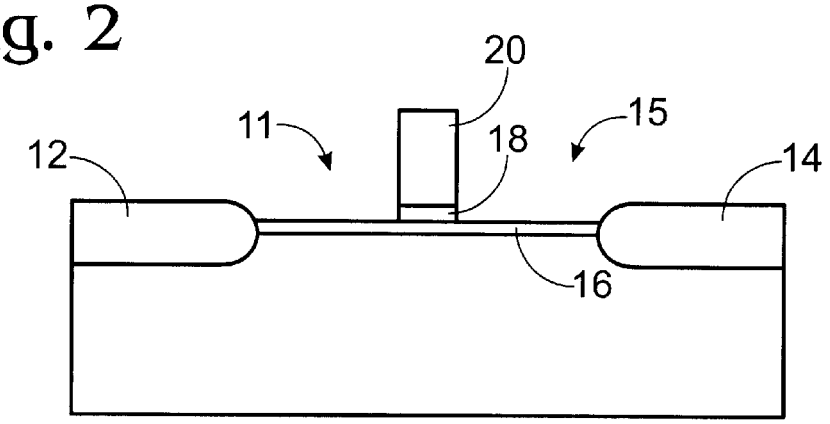

Referring now to FIG. 2, a gate oxide region 16 has been formed to a thickness of not greater than 10 nm. This oxide region may be formed by conventional or rapid thermal oxidation, chemical vapor deposition (CVD) or other suitable techniques.

At this point in the process, a layer of polysilicon material 18 may be deposited. Layer 18 has a thickness of between 10 nm and 50 nm. This layer is deposited to protect the gate oxide during the subsequent processing, and while this layer may be omitted, or replaced with any type of barrier or metal layer, it provides an effective, efficient way to protect what will become the gate region.

A layer of silicon nitride ($Si_3N_4$) 20 may be deposited to a thickness of between 300 nm and 700 nm. Appropriate photoresist material is applied and the nitride and polysilicon layers are plasma etched, resulting in a polysilicon region 18 and a nitride plug 20, as shown in FIG. 2. The etching process may be a one or two step process. In the two step process, the first etching process stops at gate oxide layer 16. A subsequent etching step removes the gate oxide layer on either side of plug 20 and region 18. In the one step process, etching removes all of the extraneous material down to the $p^-$ silicon substrate 10. Nitride plug 20, polysilicon region 18 and the remaining oxide layer 16 are referred to herein as the stacked layers. Appropriate ions are implanted to form LDD regions (not shown). Such implantation also defines, by default, a gate region 25 in the $p^-$ silicon substrate. Gate region 25 is also referred to herein as a conductive channel of a first type. Source region 22 and drain region 24 are formed by any well known processes to form a lightly doped conductive region. Such processes include LDD, MDD, and HALO structure.

Figure 3:
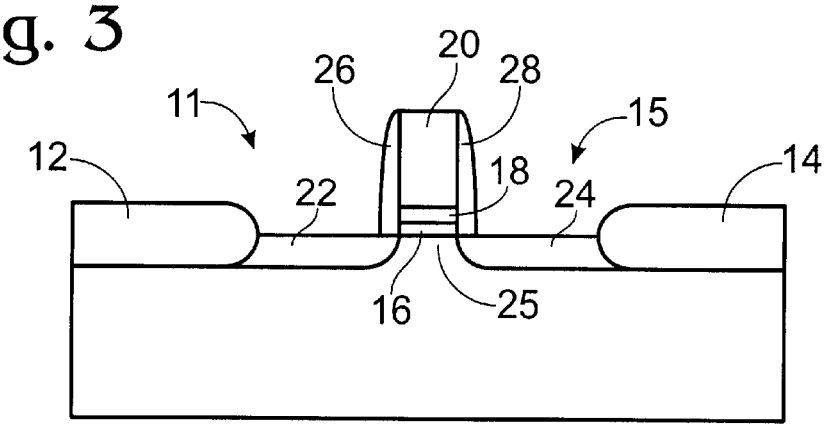

A layer of silicon oxide is formed by CVD to a thickness of between 50 nm and 200 nm over polysilicon region 18 and nitride plug 20. This oxide layer is plasma etched to form an oxide spacer 26, 28, as shown in FIG. 3, at the sidewalls of nitride plug 20. Any other insulator, other than silicon nitride, may also be used for this step of the process if desired.

Appropriate ions are implanted to form source region 22 and drain region 24 and are defused or activated. The source and drain regions are referred to herein as conductive channels of a second type, which are n$^+$ channels, and the impurities implanted in the substrate are referred to doping impurities of a second type. By way of example, the LDD may be done by phosphorous (P) or arsenic (As) ion implantation at an energy no higher than 70 keV (P) or 140 keV (As), and a dose of between $1.0 \cdot 10^{13}$ cm$^{-2}$ to $5.0 \cdot 10^{14}$ cm$^{-2}$. The n$^+$ layer may be formed by As ion implantation at an energy level of between 10 keV and 80 keV, at a does of between $1.0 \cdot 10^{15}$ cm$^{-2}$ to $5.0 \cdot 10^{15}$ cm$^{-2}$. At this point, a salicide process may also be performed if desired. The salicide (self-aligned silicide) formation process includes formation of a layer of Ti or Co to a thickness of between 30 nm to 60 nm, preferably by CVD, in a nitrogen atmosphere at 500° C. to 650° C. for Ti, or 450° C. to 600° C. for Co. The excess Ti or Co is removed by etching, and rapid thermal annealed (RTA) in nitrogen at 700° C. to 850° C. for Ti or 650° C. to 800° C. for Co.

Figure 4:
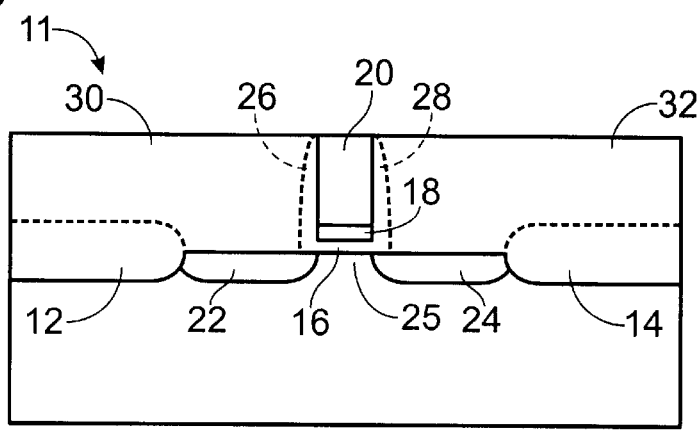

Once the source and drain regions are formed, and now referring to FIG. 4, silicon dioxide is again added by CVD to a thickness of about 1.5 to 2 times that of silicon nitride plug 20, resulting in oxide regions 30, 32. The structure is planarized, preferably by a chemical-mechanical polishing process, to expose the upper surface of silicon nitride plug 20. The planarization by CMP will provide a surface having a uniformity of approximately 5%.

Figure 5:
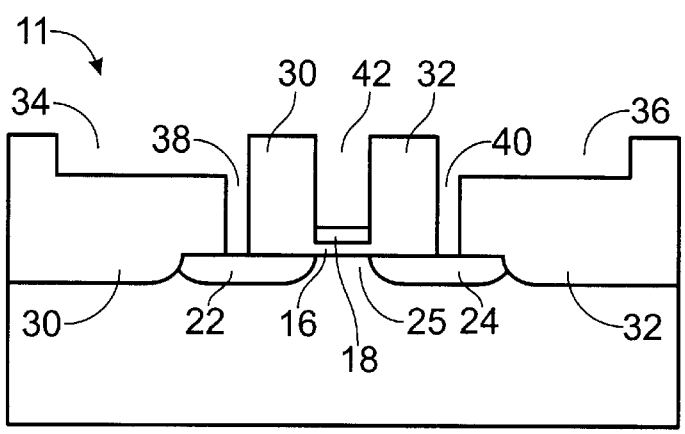

Referring now to FIG. 5, the structure is covered with photoresist to protect specified areas of oxide regions 30, 32. Trenches, 34, 36, are formed for source and drain electrodes, respectively. Via holes, 38, 40 are formed for additional portions of the source and drain electrodes, respectively, to enable to electrodes to join to their respective conductive regions. This portion of the method may involve a conventional two-mask process, a double resist process, or a halftone mask process. After the trenches and via holes, collectively referred to herein as electrode receiving structures, are formed, the photoresist is stripped off of the structure. The next step of the process includes a wet etch in phosphoric acid (H$_3$PO$_4$) solution, or any suitable selective etchant which will remove silicon nitride plug 20, but which will not etch the oxide regions 30, 32, silicon region 10, or polysilicon layer 18. The resulting structure is as depicted in FIG. 5, which allows a via hole 42 for the gate electrode.

Figure 6:
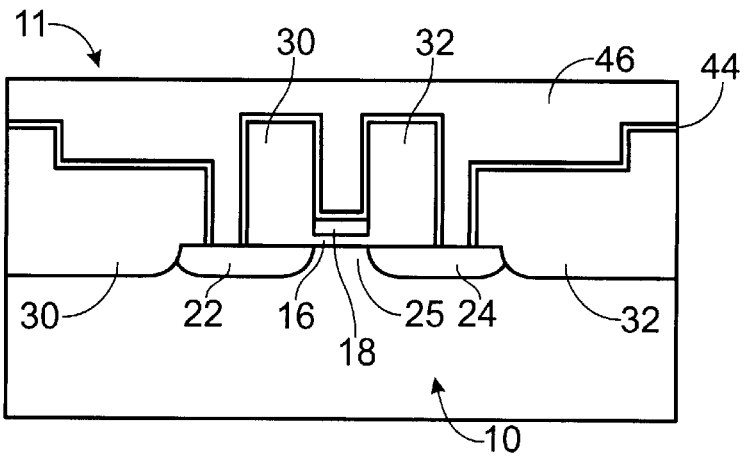
Figure 7:
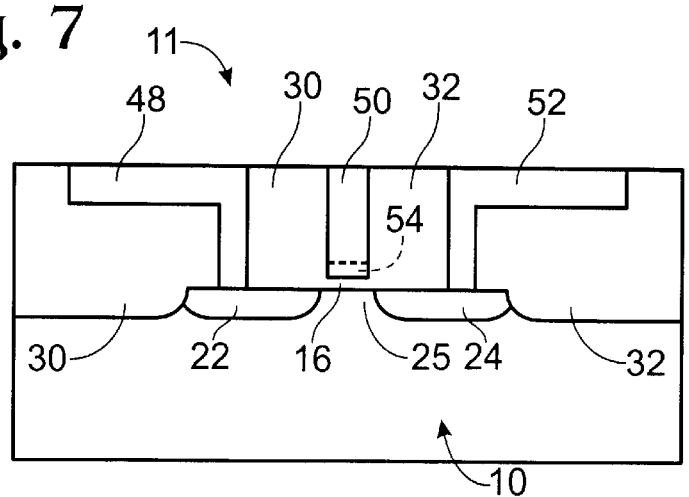
FIG. 7 is a front sectional elevation of a MOS IC constructed according to the invention.

Referring now to FIG. 6, a layer of contact metal, such as Ti, Ta, TaN, TaSiN, W, WN, WSiN, or Re, and a barrier metal such as TiN, is deposited by CVD, and depicted at 44. Next, metal material, such as copper, is deposited by MOCVD, or other CVD, PVD, and sputtering processes, and forms a region 46. As previously mentioned, other metal, such as aluminum or a refractory metal, may also be used. Metal region 46 and contact metal 44 are then planar etched, wherein the etching stops at oxide regions 30, 32, resulting, and now referring to FIG. 7, in the formation of a source electrode 48, and a gate electrode 50, and a drain electrode 52. A CMP process is preferable for this planar etching. The structure is annealed at a temperature of between 500° C. and 900° C. for one-half hour, to form a good contact between the electrodes and their conductive channels. Polysilicon layer 18 will be converted into silicide 54 during the annealing process. The conventional polysilicon gate is displaced by metal gate electrode 50. The gate length of the device is determined by the width of gate electrode 50. It will be appreciated that the structure is three-dimensional, and has a depth (into the page of the drawings) approximately equal to its width, forming a generally rectangular active region for the gate, and forming other three-dimensional structures for the other parts of the transistor.

As is evident, the materials used for the source, gate, and drain electrodes are all identical and are fabricated simultaneously during a first level interconnect. The gate is self-aligned with the source and drain region. While an n$^-$ channel MOS transistor has been used as an example, it will be understood that the same process, with proper replacement in silicon dopant, is applicable to p$^-$ channel transistors and for CMOS IC fabrication. The doping density of the channel regions is low to yield high drive current and low substrate bias effect.

Figure 8:
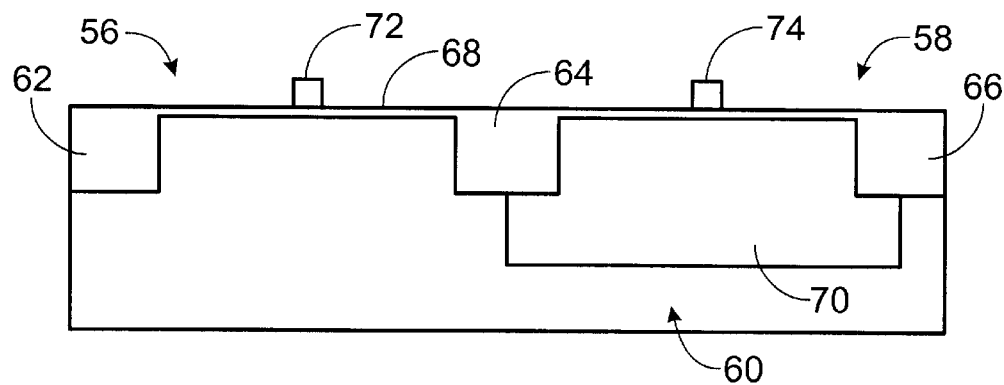
FIGS. 8–10 depict successive steps in fabrication of an alternate embodiment of the metal gate sub-micron MOS transistor of the invention.

An alternative process and structure may be formed with a local interconnect between a pair of MOS transistors, 56, 58. Referring now to FIG. 8, the same initial steps are performed, as previously described, in that a substrate 60 is properly doped to form a substrate of a proper polarity, in this case a p$^-$ substrate. Silicon dioxide insulating regions 62, 64, and 66 are formed, and a layer of silicon dioxide 68 is thermally grown or is deposited by CVD. In this embodiment, an n$^-$ well 70 is also formed, which is referred to as a conductive channel of a third type, by implanting doping impurities of a third type into the substrate, namely, phosphorous, at an energy level of 50 keV to 180 keV and a dose of $1.0 \cdot 10^{12}$ cm$^{-2}$ to $5.0 \cdot 10^{13}$ cm$^{-2}$.

Figure 9:
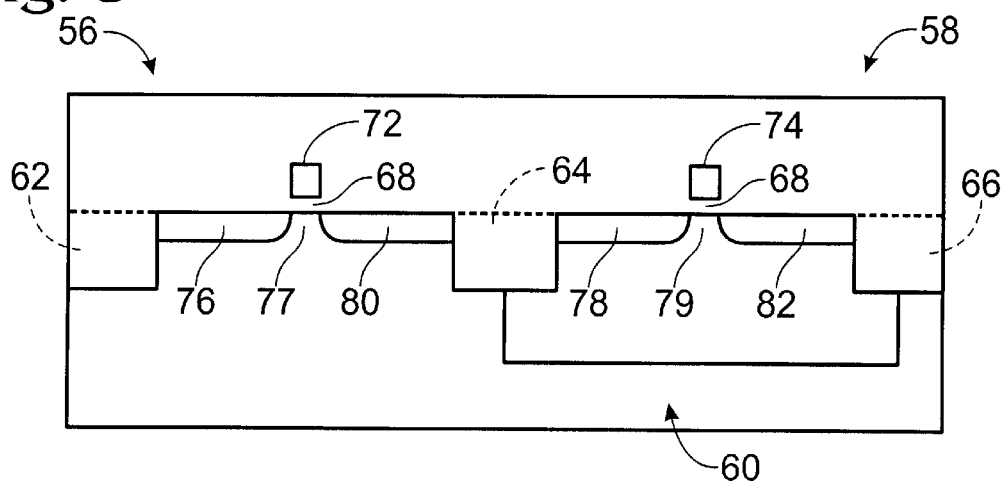

Referring now to FIG. 9, the gate electrodes of both n$^-$ channel 72 and p$^-$ channel 74 are made as previously described, i.e., by the formation of a silicon nitride replacement plug. The LDD, and p$^+$ and n$^+$ are implanted using conventional processes. The p$^-$ channel LDD may be formed by BF$_2$ at an energy of less than 100 keV and a dose of between $1.0 \cdot 10^{13}$ cm$^{-2}$ to $5.0 \cdot 10^{14}$ cm$^{-2}$. The p$^-$ channel source and drain regions may be formed by implantation of BF$_2$ ions at an energy of between 10 keV to 60 keV and a dose of $1.0 \cdot 10^{15}$ cm$^{-2}$ to $5.0 \cdot 10^{15}$ cm$^{-2}$. The optional salicide region is formed as previously described. Source regions 76, 82, and drain regions 80, 78 are formed.

Next, a layer of oxide 84 is deposited by CVD. Oxide layer 84 should be approximately three times thicker than the thickness of barrier metal 72/74. (Drawings not to scale.) The surface of oxide layer 84 is planarized, as by chemical-mechanical polishing to the configuration depicted in FIG. 9.

Figure 10:
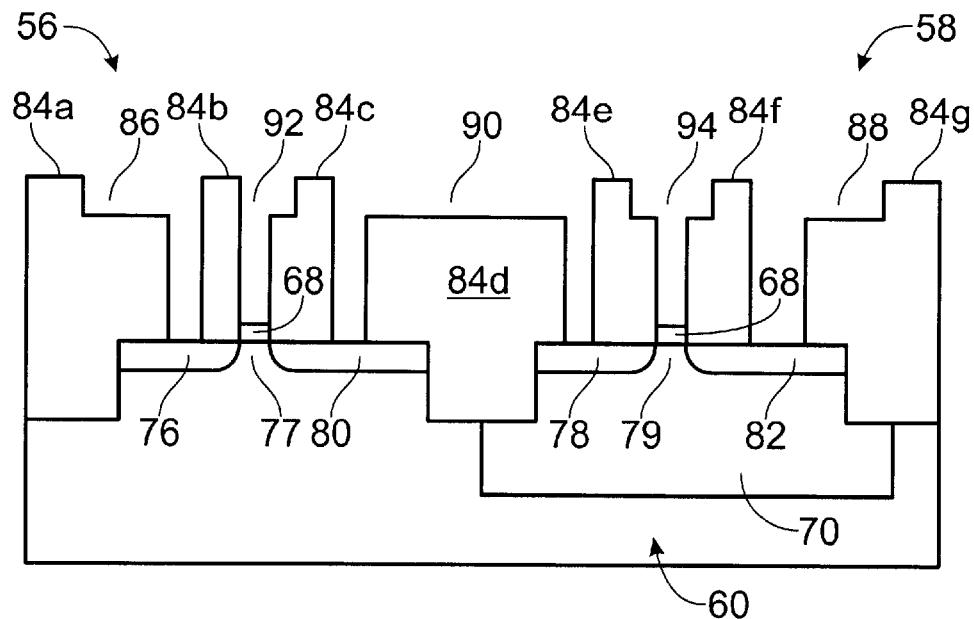

Referring now to FIG. 10, the oxide layer is covered with photoresist and is Damascene trenched and contact etched to the configuration depicted in FIG. 10, resulting in a trench and via hole 86 for a source electrode which will connect to source 76, a trench/via hole 88 which will provide a region for a source electrode which will connect to source region 82 and a trench/via hole 90, which will provide an electrode connected to drain region 80 and to drain region 78. Additionally, the oxide layer is etched away to provide holes 92 and 94 which will provide room for gate electrodes, which also include an interconnect area, which is out of the plane of the drawing, which will connect to gates 77, 79, respectively.

Figure 11:
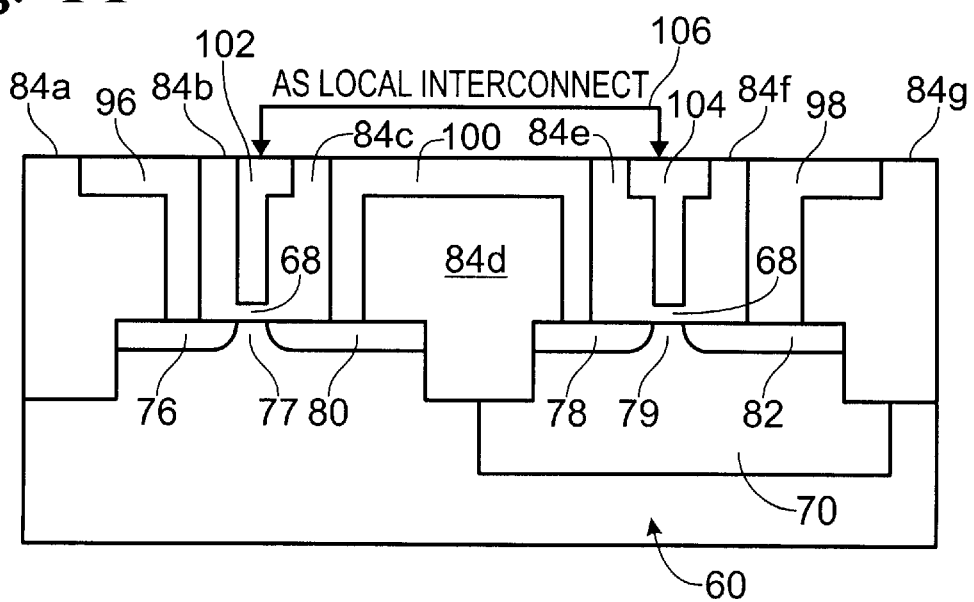
FIG. 11 is a front sectional elevation of an alternate embodiment of a MOS IC constructed according to the invention.

At this point, a second barrier metal is deposited by CVD, as was explained in connection with FIG. 6. The second barrier material may be TiN, or WN, or other suitable barrier metal which will provide good ohmic contact to both n$^+$ and p$^+$ silicon, and which are selected to prevent metal diffusion into the silicon. Metal is then deposited over the structure by CVD or sputtering, which metal may be Cu, Mo, or W, or Al, or other suitable metal. The structure is then chemically-mechanically polished to the level of the oxide regions, resulting in the configuration depicted in FIG. 11. As shown in FIG. 11, a first, NMOST source electrode 96 in formed as is a second, pMOST source electrode 98. An interconnect electrode 100 connects to nMOST drain region 80 and pMOST drain region 78. Gate electrodes 102, 104 are joined by a local interconnect 106.

Thus, a metal gate sub-micron MOS transistor, and variations thereof, have been described. The integrated circuit formed hereby is characterized by a high drive current and a low substrate bias effect. The structure is simple and is a cost-effective method for forming the metal gate sub-micron MOS transistor.

Although a preferred embodiment, and variations thereof, have been described, it will be appreciated that further variations and modifications may be made thereto without departing from the scope of the invention as defined in the appended claims.

We claim:

1. A method of forming a MOS transistor on a substrate of single crystal silicon, comprising:
    forming a silicon device area in the substrate;
    implanting doping impurities of a first type in the silicon device area to form a conductive channel of a first type for use as a gate region;
    forming an insulation region boundary on each side of the device area;
    forming a layer of silicon oxide inside of the insulation region boundary on the substrate;
    depositing a layer of silicon nitride to a thickness of about 300 nm to 700 nm over the silicon oxide layer;
    etching the silicon nitride layer and the silicon oxide layer to form a stacked layer having sidewalls, said stacked layer including a silicon nitride plug and silicon oxide over the gate region;
    depositing a layer of silicon oxide over the substrate, insulation region boundary and the stacked layer to a thickness of between about 50 nm to 200 nm;
    etching the silicon oxide to form spacers about the sidewalls of the stacked layer;
    implanting ions of a second type in said substrate to form conductive layers of a second type for use as a source region and a drain region;
    depositing a layer of silicon oxide to a thickness of between about 1.5 to 2.0 times that of the stacked layer over the insulation region boundary, the conductive layers of the second type and the stacked layer;
    planarizing the structure to expose the upper surface of the silicon nitride plug;
    selectively etching the structure to remove the silicon nitride plug, thereby forming an electrode receiving structure for a gate electrode;
    depositing a layer of electrode metal to form a metal gate; and
    planar etching the structure.

2. The method of claim 1 wherein said forming of the first conductive layer includes implanting ions of boron at and energy level in a range of between about 30 keV and 50 keV, and a dose in a range of between about $1.0 \cdot 10^{12}$ cm$^{-2}$ to $5.0 \cdot 10^{14}$ cm$^{-2}$, to form a p$^-$ well.

3. The method of claim 1 wherein said forming of the second conductive layer includes implanting ions of arsenic at and energy level in a range of between about 10 keV to 80 keV and a dose in a range of between about $1.0 \cdot 10^{12}$ cm$^{-2}$ to $5.0 \cdot 10^{15}$ cm$^{-2}$, to form a n$^+$ layer.

4. The method of claim 1 wherein said depositing a layer of electrode metal includes depositing a layer of metal taken from the group of metals consisting of Cu, Al and refractory metals.

5. The method of claim 1 which further includes forming a conductive layer of a third type in said substrate adjacent the first mentioned active region and forming a second MOS transistor thereon.

6. The method of claim 5 which includes interconnecting the gate electrodes of the two MOS transistors and interconnecting the drain electrode of the first mentioned MOS transistor with the drain electrode of the second mentioned MOS transistor.

7. A method of forming a MOS transistor on a substrate of single crystal silicon, comprising:
    forming a silicon device area in the substrate;
    implanting doping impurities of a first type in the silicon device area to provide a conductive channel of a first type in a gate region of the silicon device area;
    forming an insulation region boundary on each side of the device area;
    forming a layer of silicon oxide on the substrate;
    depositing a layer of silicon nitride on the silicon oxide layer;
    etching the silicon nitride layer to form a silicon nitride plug over the gate region, said silicon nitride plug having sidewalls;
    depositing a layer of silicon oxide over the substrate, insulation region boundary and the silicon nitride plug;
    etching the silicon oxide to form spacers about the sidewalls of the silicon nitride plug;
    implanting ions of a second type in said substrate to form conductive regions of a second type for use as a source region and a drain region;
    depositing a layer of silicon oxide to a thickness exceeding that of the silicon nitride plug over the insulation region boundary, the conductive layers of the second type and the silicon nitride plug;
    planarizing the structure to expose the upper surface of the silicon nitride plug;
    selectively etching the structure to remove the silicon nitride plug, thereby forming an electrode receiving structure for a gate electrode;
    depositing a layer of electrode metal to form a metal gate in said electrode receiving structure; and
    chemically-mechanically polishing the structure.

8. The method of claim 7 wherein said depositing a layer of electrode metal includes depositing a layer of metal taken from the group of metals consisting of Cu, Mo, W and Al.

9. The method of claim 7 wherein, before said step of depositing a layer of electrode metal, the method includes depositing a layer of barrier material to form a barrier layer in said electrode receiving structure.

10. The method of claim 9 wherein said step of depositing a layer of barrier material includes deposing a barrier material taken from the group consisting of TiN and WN.

11. The method of claim 10 wherein said step of depositing a layer of electrode metal includes depositing a layer Cu.

12. The method of claim 7 wherein, after said step of etching the silicon nitride layer to form a silicon nitride plug and before said step of depositing a layer of silicon oxide, implanting ions to form lightly doped conductive regions defining the conductive channel in said gate region of the substrate.

13. A method of forming a MOS transistor on a substrate of single crystal silicon, comprising:

forming a silicon device area in the substrate, including implanting doping impurities of a first type in the substrate to provide a conductive channel of a first type and forming insulation region boundaries around each device area;

forming a layer of silicon oxide on the substrate;

depositing a layer of silicon nitride on the silicon oxide layer;

etching the silicon nitride layer to form a silicon nitride plug over the conductive channel region of each device area;

implanting ions of a second type in each said device area of the substrate to form conductive regions of a second type for use as a source region and a drain region;

depositing a layer of silicon oxide to a thickness exceeding that of the silicon nitride plug over the insulation region boundary, the conductive layers of the second type and the silicon nitride plug;

planarizing the structure to expose the upper surface of the silicon nitride plug;

selectively etching the structure to remove the silicon nitride plug, thereby forming an electrode receiving structure for a gate electrode; and depositing a layer of electrode metal to form a metal gate in said electrode receiving structure.

14. The method of claim 13 wherein said depositing a layer of electrode metal includes depositing a layer of metal taken from the group of metals consisting of Cu, Mo, W and Al.

15. The method of claim 13 wherein, before said step of depositing a layer of electrode metal, the method includes depositing a layer of barrier material to form a barrier layer in said electrode receiving structure.

16. The method of claim 15 wherein said step of depositing a layer of barrier material includes deposing a barrier material taken from the group consisting of TiN and WN.

17. The method of claim 16 wherein said step of depositing a layer of electrode metal includes depositing a layer Cu.

18. The method of claim 13 wherein, after said step of etching the silicon nitride layer to form a silicon nitride plug, the method further includes a step of depositing a layer of silicon oxide over the structure and etching to form spacers on said silicon nitride plug.

* * * * *